(12) United States Patent
Kim et al.

(10) Patent No.: US 11,705,350 B2
(45) Date of Patent: Jul. 18, 2023

(54) APPARATUS AND METHOD FOR TREATING SUBSTRATE

(71) Applicant: SEMES CO., LTD., Cheonan-si (KR)

(72) Inventors: Sun Mi Kim, Jeollanam-do (KR); Jisu Hong, Chungcheongnam-do (KR); Moonsik Choi, Seoul (KR); Oh Jin Kwon, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 409 days.

(21) Appl. No.: 16/705,065

(22) Filed: Dec. 5, 2019

(65) Prior Publication Data
US 2020/0185236 A1    Jun. 11, 2020

(30) Foreign Application Priority Data
Dec. 6, 2018    (KR) .................. 10-2018-0156106

(51) Int. Cl.
*H01L 21/67*    (2006.01)
*H01L 21/027*    (2006.01)

(52) U.S. Cl.
CPC ...... *H01L 21/6715* (2013.01); *H01L 21/0273* (2013.01); *H01L 21/67051* (2013.01)

(58) Field of Classification Search
CPC ......... H01L 21/67115; H01L 21/67051; H01L 21/67028
See application file for complete search history.

(56) References Cited

U.S. PATENT DOCUMENTS

| | | | |
|---|---|---|---|
| 2003/0051742 A1* | 3/2003 | Boyers | H01L 21/31133 134/30 |
| 2007/0082496 A1 | 4/2007 | Orii et al. | |
| 2010/0071718 A1* | 3/2010 | Le | H01L 21/31138 134/1 |
| 2017/0341106 A1* | 11/2017 | Bang | B05D 3/10 |

FOREIGN PATENT DOCUMENTS

| | | |
|---|---|---|
| JP | 2005136346 A | 5/2005 |
| JP | 2005-228790 A | 8/2005 |
| JP | 2008-036584 A | 2/2008 |
| JP | 2009-218548 A | 9/2009 |
| JP | 2009218548 A | 9/2009 |
| JP | 2012160597 A * | 8/2012 |
| JP | 6094851 B | 3/2017 |
| KR | 10-2007-0040297 A | 4/2007 |
| KR | 10-0848981 B | 7/2008 |

OTHER PUBLICATIONS

Machine translation: JP 2008036584; Ueno et al. (Year: 2008).*
Office Action for related Korean Patent Application No. 10-2018-0156106 dated Nov. 22, 2019 (8 pages).
Notice of Allowance for related Korean Patent Application No. 10-2018-0156106 dated May 22, 2020 (5 pages).

* cited by examiner

*Primary Examiner* — Natasha N Campbell
(74) *Attorney, Agent, or Firm* — Procopio, Cory, Hargreaves & Savitch LLP

(57) ABSTRACT

The inventive concept provides an apparatus and method for removing a film formed on a substrate. A method for treating the substrate includes a primary solvent dispensing step of dispensing an organic solvent onto the substrate to remove a photoresist film on the substrate and an ozone dispensing step of dispensing a liquid containing ozone onto the substrate to remove organic residue on the substrate, after the primary solvent dispensing step.

6 Claims, 6 Drawing Sheets

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2018-0156106 filed on Dec. 6, 2018, in the Korean Intellectual Property Office, the entire contents of which are hereby incorporated by reference.

BACKGROUND

Embodiments of the inventive concept described herein relate to an apparatus and method for treating a substrate with liquids, and more particularly, relate to an apparatus and method for removing a film formed on a substrate.

To manufacture semiconductor elements, desired patterns are formed on a substrate through various processes such as photolithography, etching, ashing, ion implantation, thin film deposition, and the like. As time passes, the processes are diversified and complicated, and therefore contaminants and particles are generated. Due to this, a cleaning process of cleaning the substrate is performed before and after each of the processes.

In general, the cleaning process includes a process of removing a film formed on the substrate. However, it is not easy to remove the film because the adhesive force of the film to the substrate surface is strong. Due to this, strong acidic chemicals, such as sulfuric acid, are used as processing liquids for removing the film.

However, the processing liquids for removing the film are generally more expensive than liquids used to clean the substrate. Furthermore, the strong acidic chemicals generate a large amount of fumes during the cleaning process and damage and contaminate surrounding devices. In addition, the strong acidic chemicals act as main environmental-pollution inducement coefficients because it is difficult to recycle the strong acidic chemicals.

SUMMARY

Embodiments of the inventive concept provide an apparatus and method for preventing surrounding devices from being damaged and contaminated by chemicals used to remove a film on a substrate.

Furthermore, embodiments of the inventive concept provide an apparatus and method for lowering a cost burden of chemicals used to remove a film.

In addition, embodiments of the inventive concept provide an apparatus and method for reducing environmental contamination caused by chemicals used to remove a film.

According to an exemplary embodiment, a method for treating a substrate includes a primary solvent dispensing step of dispensing an organic solvent onto the substrate to remove a photoresist film on the substrate and an ozone dispensing step of dispensing a liquid containing ozone onto the substrate to remove organic residue on the substrate, after the primary solvent dispensing step.

The organic solvent may include isopropyl alcohol (IPA), ethanol, methanol, isopropyl acetate, or acetone, and the liquid may include ozone water, or hydrofluoric acid that contains ozone. The method may further include a secondary solvent dispensing step of dispensing an organic solvent onto the photoresist film to dry the substrate, after the ozone dispensing step.

The organic solvent in the primary solvent dispensing step and the organic solvent in the secondary solvent dispensing step may be of the same type.

According to an exemplary embodiment, a method for treating a substrate includes dispensing one of a liquid containing ozone and an organic solvent prior to the other onto the substrate to remove a photoresist film on the substrate. In removing the photoresist film, the liquid containing the ozone and the organic solvent are dispensed in different sequences, depending on whether the photoresist film has ions implanted therein.

When the photoresist film is a film in which the ions are implanted, the organic solvent may be dispensed after the liquid containing the ozone is dispensed. The organic solvent may include isopropyl alcohol (IPA), ethanol, methanol, isopropyl acetate, or acetone, and the liquid may include ozone water, or hydrofluoric acid that contains ozone.

When the photoresist film is a film in which the ions are not implanted, the liquid containing the ozone may be dispensed after the organic solvent is dispensed. When the photoresist film is a film in which the ions are not implanted, the organic solvent may be additionally dispensed after the liquid containing the ozone is dispensed.

According to an exemplary embodiment, an apparatus for treating a substrate includes a substrate support unit that supports the substrate, a liquid dispensing unit that dispenses a liquid onto the substrate, which is supported on the substrate support unit, to remove a photoresist film on the substrate, and a controller that controls the liquid dispensing unit. The liquid dispensing unit includes a solvent nozzle that dispenses an organic solvent and an ozone nozzle that dispenses a liquid containing ozone. The controller controls the liquid dispensing unit to dispense the organic solvent onto the substrate to remove the photoresist film and thereafter dispense the liquid containing the ozone to remove organic residue on the substrate.

The controller may control the liquid dispensing unit to additionally dispense the organic solvent after dispensing the liquid containing the ozone.

According to an exemplary embodiment, an apparatus for treating a substrate includes a substrate support unit that supports the substrate, a liquid dispensing unit that dispenses a liquid onto the substrate, which is supported on the substrate support unit, to remove a photoresist film on the substrate, and a controller that controls the liquid dispensing unit. The liquid dispensing unit includes a solvent nozzle that dispenses an organic solvent and an ozone nozzle that dispenses a liquid containing ozone. The controller may control the liquid dispensing unit to dispense the liquid containing the ozone and the organic solvent in different sequences, depending on whether the photoresist film has ions implanted therein.

When the photoresist film is a film in which the ions are implanted, the controller may control the liquid dispensing unit to dispense the organic solvent after dispensing the liquid containing the ozone.

When the photoresist film is a film in which the ions are not implanted, the controller may control the liquid dispensing unit to dispense the liquid containing the ozone after dispensing the organic solvent. When the photoresist film is a film in which the ions are not implanted, the controller may control the liquid dispensing unit to additionally dispense the organic solvent after dispensing the liquid containing the ozone.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
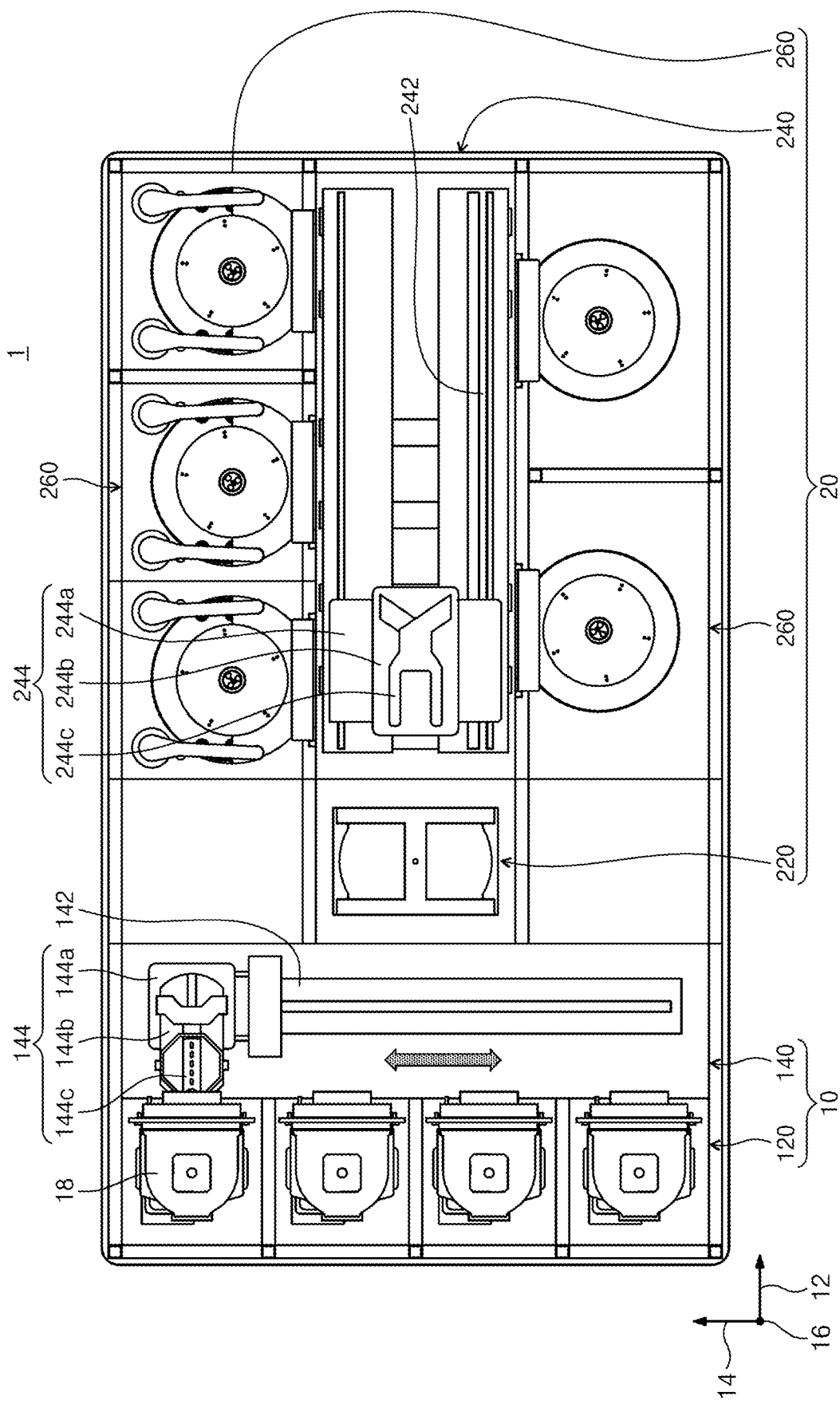
FIG. 1 is a plan view illustrating substrate treating equipment according to an embodiment of the inventive concept.

Various modifications and variations can be made to embodiments of the inventive concept, and the scope of the inventive concept should not be constructed as limited to the embodiments set forth herein. These embodiments are provided so that this disclosure will be thorough and complete, and will fully convey the scope of the inventive concept to those skilled in the art. Accordingly, in the drawings, the shapes of components are exaggerated for clarity of illustration.

Hereinafter, embodiments of the inventive concept will be described in detail with reference to FIGS. 1 to 8.

FIG. 1 is a plan view illustrating substrate treating equipment according to an embodiment of the inventive concept.

Referring to FIG. 1, the substrate treating equipment 1 has an index module 10 and a process module 20. The index module 10 has load ports 120 and a transfer frame 140. The load ports 120, the transfer frame 140, and the process module 20 are sequentially arranged in a row. Hereinafter, the direction in which the load ports 120, the transfer frame 140, and the process module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

Carriers 18 having substrates W received therein are placed on the load ports 120. The load ports 120 are arranged in a row along the second direction 14. FIG. 1 illustrates one example that the index module 10 includes four load ports 120. However, the number of load ports 120 may be increased or decreased depending on conditions such as process efficiency and footprint of the process module 20. Each of the carriers 18 has slots (not illustrated) that are formed therein to support the edges of the substrates W. The slots are arranged in the third direction 16, and the substrates W are stacked one above another with a spacing gap therebetween in the carrier 18 along the third direction 16. A front opening unified pod (FOUP) may be used as the carrier 18.

The process module 20 has a buffer unit 220, a transfer chamber 240, and process chambers 260. The transfer chamber 240 is arranged such that the lengthwise direction thereof is parallel to the first direction 12. The process chambers 260 are disposed on opposite sides of the transfer chamber 240 along the second direction 14. The process chambers 260 may be provided in a symmetric arrangement with respect to the transfer chamber 240. Some of the process chambers 260 are arranged along the lengthwise direction of the transfer chamber 240. Furthermore, other process chambers 260 are stacked one above another. That is, the process chambers 260 may be arranged in an A×B array (A and B being natural numbers of 1 or larger) on the opposite sides of the transfer chamber 240. Here, "A" denotes the number of process chambers 260 arranged in a row along the first direction 12, and "B" denotes the number of process chambers 260 arranged in a column along the third direction 16. In the case where four or six process chambers 260 are provided on the opposite sides of the transfer chamber 240, the process chambers 260 may be arranged in a 2×2 or 3×2 array. The number of process chambers 260 may be increased or decreased.

Alternatively, the process chambers 260 may be provided on only one side of the transfer chamber 240. In another case, the process chambers 260 may be provided in a single layer on the one side and the opposite side of the transfer chamber 240. Unlike those described above, the process chambers 260 may be provided in various arrangements. Among the process chambers 260, the process chambers 260 on the one side of the transfer chamber 240 may perform a process of treating a substrate with liquids, and the process chambers 260 on the opposite side of the transfer chamber 240 may perform a process of drying the substrate subjected to the liquid treating process. The drying process may be a supercritical drying process.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) therein, on which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 18 placed on the load ports 120 and the buffer unit 220. An index rail 142 and an index robot 144 are provided in the transfer frame 140. The index rail 142 is arranged such that the lengthwise direction thereof is parallel to the second direction 14. The index robot 144 is installed on the index rail 142 and rectilinearly moves in the second direction 14 along the index rail 142. The index robot 144 has a base 144a, a body 144b, and index arms 144c. The base 144a is installed so as to be movable along the index rail 142. The body 144b is combined with the base 144a. The body 144b is movable on the base 144a along the third direction 16. Furthermore, the body 144b is rotatable on the base 144a. The index arms 144c are combined with the body 144b and are movable forward and backward relative to the body 144b. The index arms 144c may individually operate. The index arms 144c are stacked one above another with a spacing gap therebetween along the third direction 16. Some of the index arms 144c may be used to transfer the substrates W from the process module 20 to the carriers 18, and the other index arms 144c may be used to transfer the substrates W from the carriers 18 to the process module 20. Accordingly, particles generated from the substrates W that are to be treated may be prevented from adhering to the treated substrates W in the process in which the index robot 144 transfers the substrates W between the carriers 18 and the process module 20.

The transfer chamber 240 transfers the substrates W between the buffer unit 220 and the process chambers 260. A guide rail 242 and a main robot 244 are provided in the transfer chamber 240. The guide rail 242 is arranged such that the lengthwise direction thereof is parallel to the first direction 12. The main robot 244 is installed on the guide rail 242 and rectilinearly moves on the guide rail 242 along the first direction 12.

A substrate treating apparatus 300 provided in each of the process chambers 260 will be described below. In this embodiment, it will be exemplified that the substrate treating apparatus 300 performs a liquid treating process on a substrate. The liquid treating process includes a process of removing a film formed on the substrate.

Figure 2:
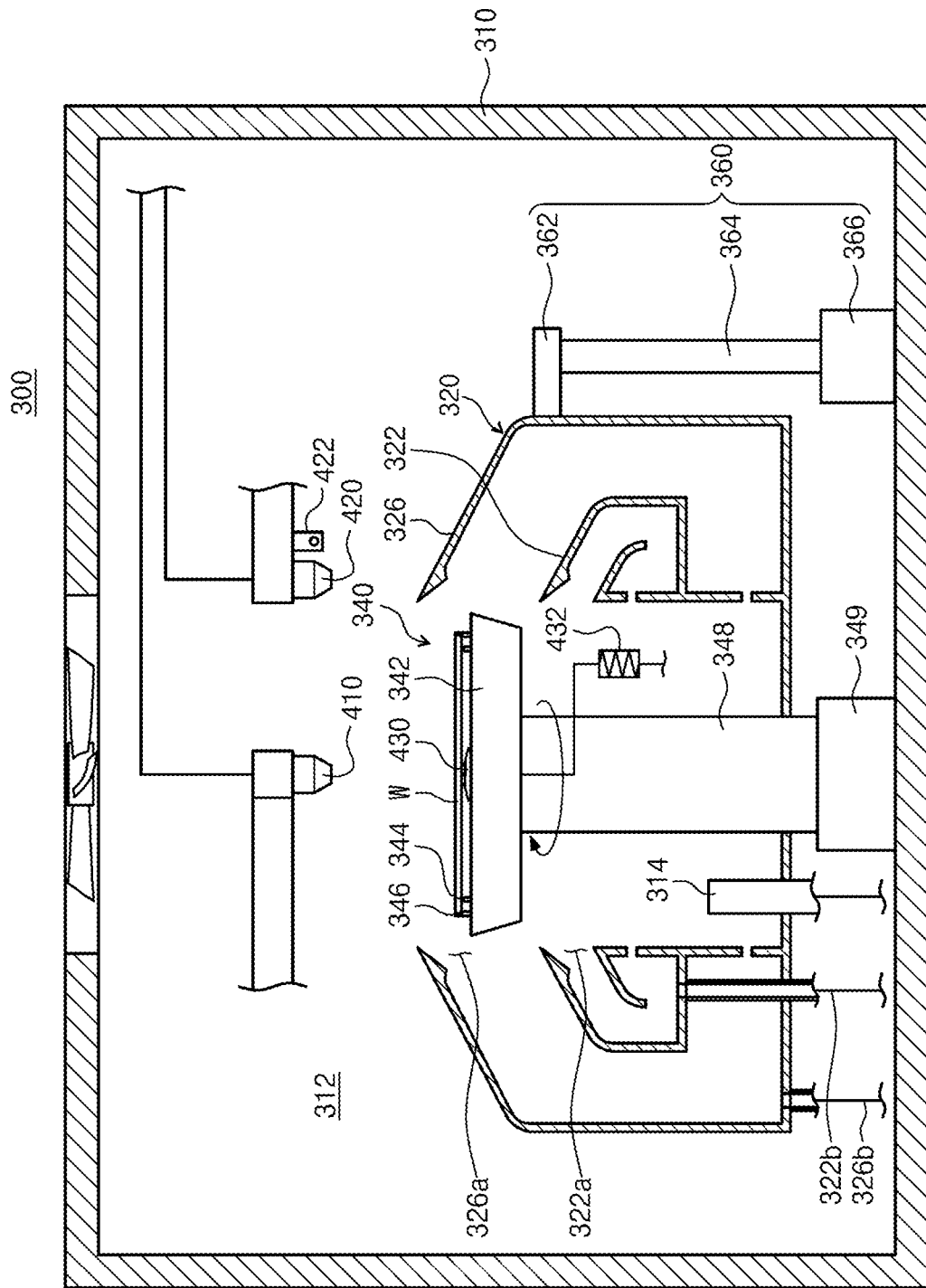
FIG. 2 is a sectional view illustrating a substrate treating apparatus of FIG. 1.

FIG. 2 is a sectional view illustrating the substrate treating apparatus of FIG. 1. Referring to FIG. 2, the substrate treating apparatus 300 includes a chamber 310, a processing vessel 320, a spin head 340, a lifting unit 360, a liquid dispensing unit 400, and a controller 500. The chamber 310 provides a process space 312 in which a process of treating the substrate W is performed. An exhaust tube 314 is installed at the bottom of the chamber 310. The exhaust tube 314 serves as a tube for evacuating the process space 312. A pressure-reducing member (not illustrated) may be connected to the exhaust tube 314.

The processing vessel 320 is located in the process space 312 and has a cup shape that is open at the top. The processing vessel 320 is located to hide the exhaust tube 314 when viewed from above. The processing vessel 320 has an inner recovery bowl 322 and an outer recovery bowl 326. The recovery bowls 322 and 326 recover different processing liquids used in the liquid treating process. The inner recovery bowl 322 has an annular ring shape that surrounds the spin head 340, and the outer recovery bowl 326 has an annular ring shape that surrounds the inner recovery bowl 322. An inner space 322a of the inner recovery bowl 322 and a space 326a between the outer recovery bowl 326 and the inner recovery bowl 322 function as inlets through which the processing fluids are introduced into the inner recovery bowl 322 and the outer recovery bowl 326, respectively. The recovery bowls 322 and 326 have recovery lines 322b and 326b connected thereto, which vertically extend downward from the bottoms of the recovery bowls 322 and 326. The recovery lines 322b and 326b function as drain tubes for draining the processing liquids introduced through the recovery bowls 322 and 326. The drained processing liquids may be reused through an external processing liquid regeneration system (not illustrated).

The spin head 340 is a substrate support unit that supports and rotates the substrate W. The spin head 340 is disposed inside the processing vessel 320. The spin head 340 supports and rotates the substrate W during the process. The spin head 340 has a body 342, a support pin 344, a chuck pin 346, and a support shaft 348. The body 342 has an upper surface with a substantially circular shape when viewed from above. The support shaft 348 that is able to be rotated by a motor 349 is fixedly coupled to the bottom of the body 342. A plurality of support pins 344 are provided. The support pins 344 are arranged on an edge portion of the upper surface of the body 342 at predetermined intervals and protrude upward from the body 342. The support pins 334 are arranged to have an annular ring shape as a whole by a combination thereof. The support pins 344 support the edge of the backside of the substrate W such that the substrate W is spaced apart from the upper surface of the body 342 by a predetermined distance. A plurality of chuck pins 346 are provided. The chuck pins 346 are located farther away from the center of the body 342 than the support pins 344. The chuck pins 346 protrude upward from the body 342. The chuck pins 346 support the side of the substrate W to prevent the substrate W from deviating from the correct position to a side when the spin head 340 rotates. The chuck pins 346 are rectilinearly movable between a standby position and a support position along the radial direction of the body 342. The standby position is a position farther away from the center of the body 342 than the support position. The chuck pins 346 are located in the standby position when the substrate W is loaded onto or unloaded from the spin head 340. The chuck pins 346 are located in the support position when the process is performed on the substrate W. In the support position, the chuck pins 346 are brought into contact with the side of the substrate W.

The lifting unit 360 adjusts the relative height between the processing vessel 320 and the spin head 340. The lifting unit 360 rectilinearly moves the processing vessel 320 in the vertical direction. The height of the processing vessel 320 relative to the spin head 340 is varied as the processing vessel 320 is vertically moved. The lifting unit 360 has a bracket 362, a movable shaft 364, and an actuator 366. The bracket 362 is fixedly attached to the outer wall of the processing vessel 320. The movable shaft 364 is fixedly coupled to the bracket 362 and is vertically moved by the actuator 366. When the substrate W is placed on the spin head 340 or lifted up from the spin head 340, the processing vessel 320 is lowered to cause the spin head 340 to protrude above the processing vessel 320. Furthermore, when the process is performed, the height of the processing vessel 320 is adjusted depending on the types of processing liquids dispensed onto the substrate W, thereby enabling the processing liquids to be introduced into the preset recovery bowls 322 and 326.

Unlike that described above, the lifting unit 360 may vertically move the spin head 340 instead of the processing vessel 320.

The liquid dispensing unit 400 dispenses various types of liquids onto the substrate W. The liquid dispensing unit 400 dispenses the liquids to remove the film on the substrate W. The film on the substrate W includes a photoresist film. Referring to FIG. 2, the liquid dispensing unit 400 includes a solvent nozzle 410, an ozone nozzle 420, and a back nozzle 430. The solvent nozzle 410 and the ozone nozzle 420 dispense liquids onto the top side of the substrate W, and the back nozzle 430 dispenses a liquid onto the backside of the substrate W. The solvent nozzle 410 and the ozone nozzle 420 (hereinafter, referred to as the nozzles) are moved between a process position and a standby position. Here, the process position is a position in which the nozzles 410 and 420 are able to dispense the liquids onto the substrate W located in the processing vessel 320, and the standby position is a position in which the nozzles 410 and 420 stand by outside the process position. According to an embodiment, the process position may be a position in which the nozzles 410 and 420 are able to dispense the liquids onto the center of the substrate W. For example, when viewed from above, the nozzles 410 and 420 may be rectilinearly moved or swung between the process position and the standby position.

The back nozzle 430 is installed on the body 342 of the spin head 340 and dispenses constant temperature water onto the backside of the substrate W. The constant temperature water is dispensed onto the center of the backside of the substrate W and is spread over the entire backside of the substrate W. The temperature of the substrate W is adjusted by the constant temperature water. The temperature of the substrate W affects the reactivity of an ozone liquid with the photoresist film. For example, the temperature of the substrate W may be proportional to the reactivity of the ozone liquid with the photoresist film. The constant temperature water may be deionized water heated by a heater 432.

The solvent nozzle 410 and the ozone nozzle 420 dispense different types of liquids. The solvent nozzle 410 dispenses an organic solvent, and the ozone nozzle 420 dispenses a liquid containing ozone (hereinafter, referred to as the ozone liquid). One of the organic solvent and the ozone liquid is dispensed prior to the other. A lamp 422 that supplies light is installed on one side of the ozone nozzle 420. The light may be UV light. The light may generate hydroxyl radicals from the ozone liquid. According to an embodiment, the sequence in which the organic solvent and the ozone liquid are dispensed may vary depending on the type of the photoresist film. The sequence in which the organic solvent and the ozone liquid are dispensed may vary depending on whether the photoresist film has ions implanted therein. The organic solvent and the ozone liquid play different roles depending on the dispensing sequence. The organic solvent may include isopropyl alcohol (IPA), ethanol, methanol, isopropyl acetate, or acetone. The ozone liquid may be ozone water, or hydrofluoric acid that contains ozone.

The controller 500 controls the liquid dispensing unit 400. The controller 500 controls the liquid dispensing unit 400 to dispense one of the organic solvent and the ozone liquid prior to the other. The sequence in which the organic solvent and the ozone liquid are dispensed varies depending on whether the photoresist film has ions implanted therein. In the case of an ion implanted photoresist film, the ozone liquid may be dispensed prior to the organic solvent. Alternatively, in the case of a non-ion implanted photoresist film, the organic solvent may be dispensed prior to the ozone liquid.

The ion implanted photoresist film has a cured state, compared with the non-ion implanted photoresist film. Due to this, in the case of removing the photoresist film with the organic solvent, the ion implanted photoresist film has a lower removal rate than the non-ion implanted photoresist film. Therefore, before the organic solvent is dispensed, the ozone liquid is dispensed onto the ion implanted photoresist film while UV light is supplied thereto. The ozone liquid generates hydroxyl radicals (OH*) by UV light, and the hydroxyl radicals (OH*) form cracks in the ion implanted photoresist film. The cracks raise the permeability of the organic solvent to the ion implanted photoresist film, thereby increasing the solubility between the organic solvent and the ion implanted photoresist film and increasing the removal rate of the ion implanted photoresist film.

In contrast, the non-ion implanted photoresist film is firstly removed by the organic solvent, and organic residue is secondly removed by the ozone liquid. Accordingly, the film removal rate may be increased.

Figure 3:
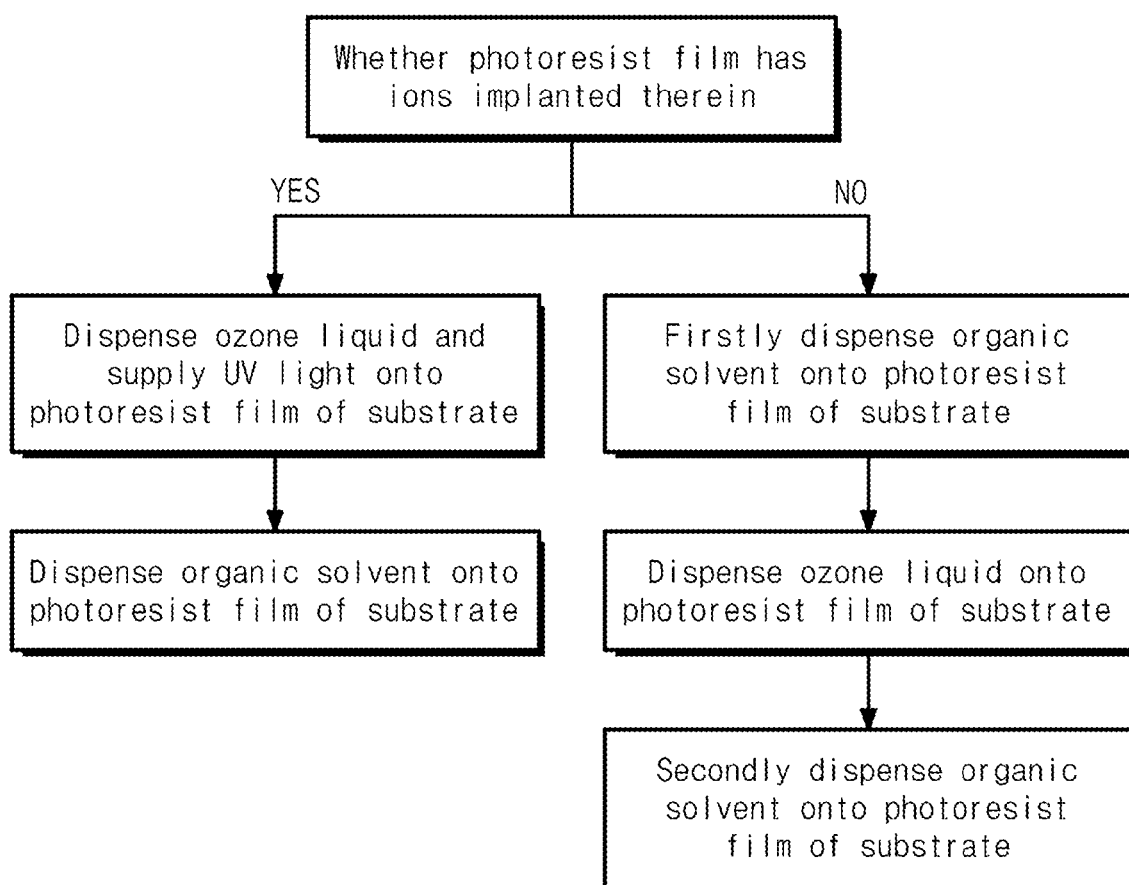
FIG. 3 is a flowchart illustrating a process of treating a substrate.
Figure 4:
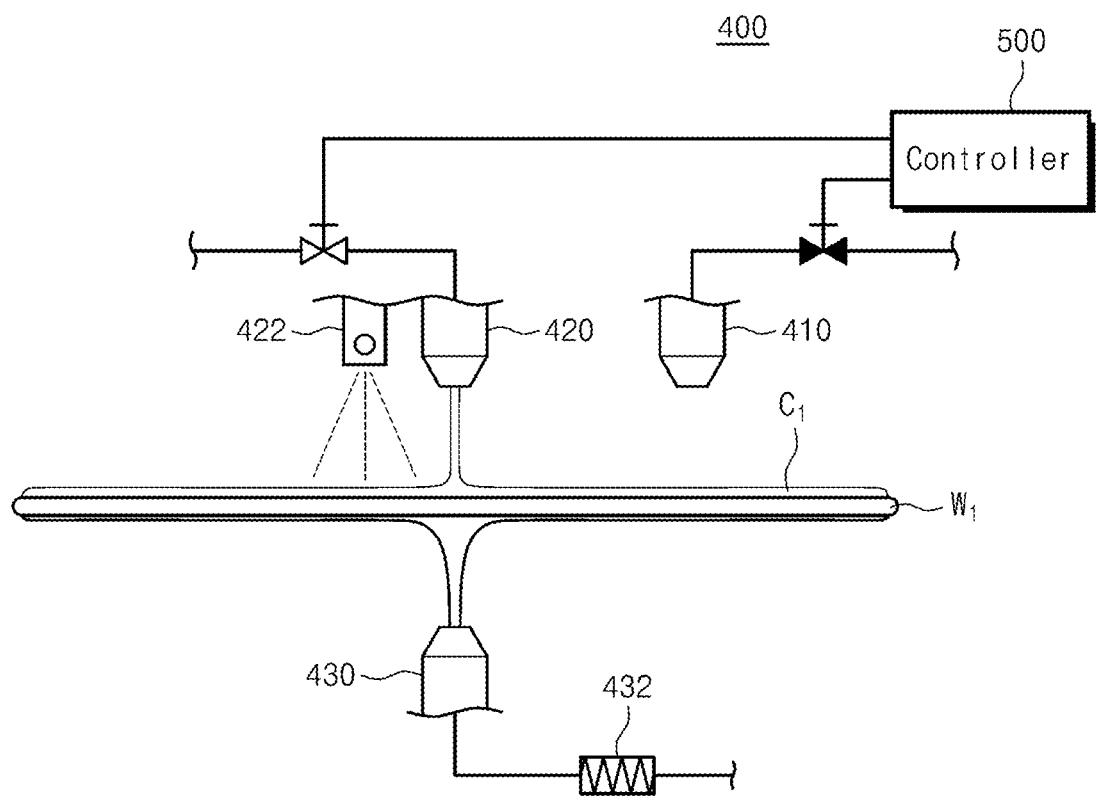
FIGS. 4 and 5 are views illustrating a process of removing a first film on a first substrate using the apparatus of FIG. 2.
Figure 5:
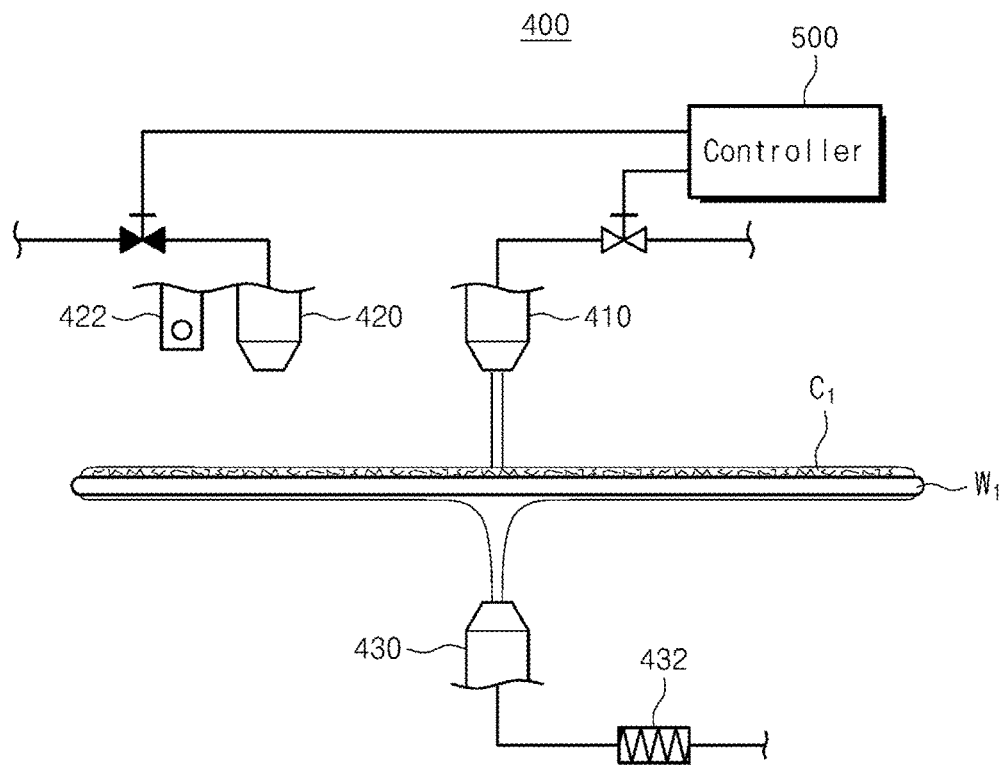
Figure 6:
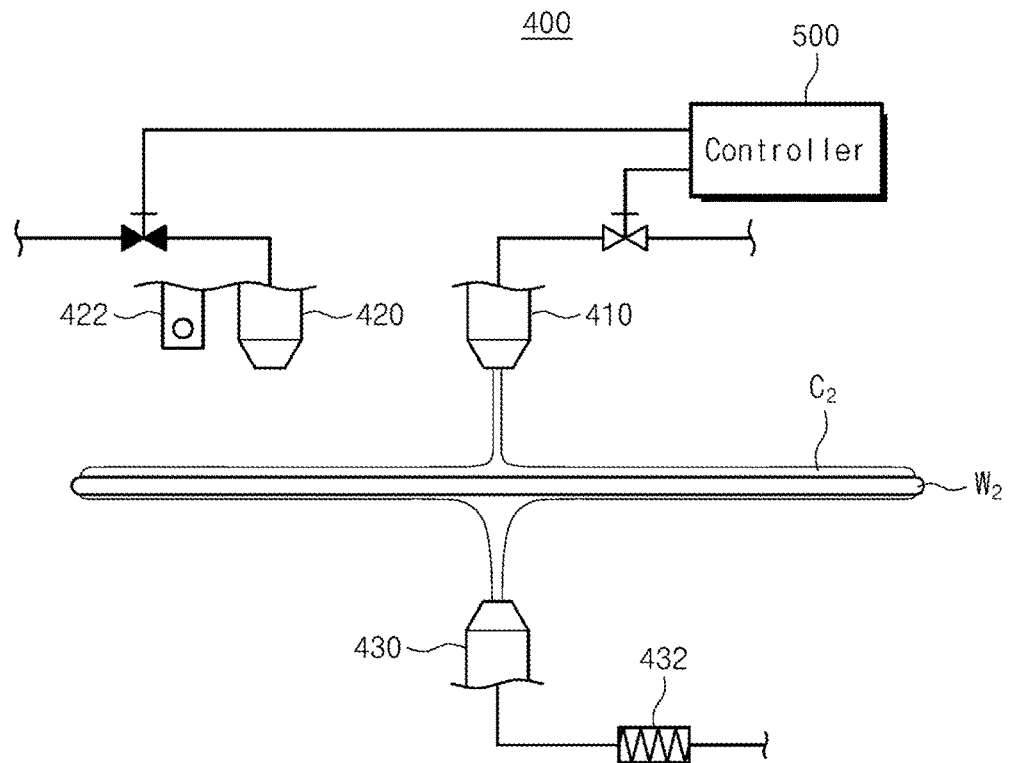
FIGS. 6 to 8 are views illustrating a process of removing a second film on a second substrate using the apparatus of FIG. 2.
Figure 7:
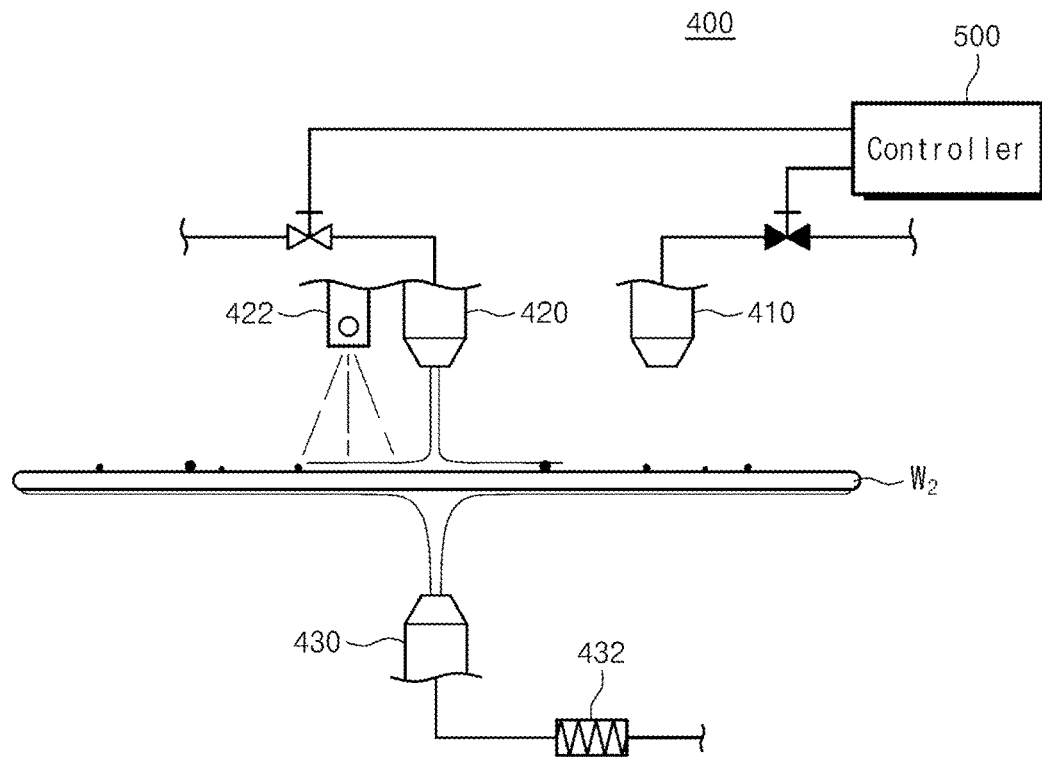
Figure 8:
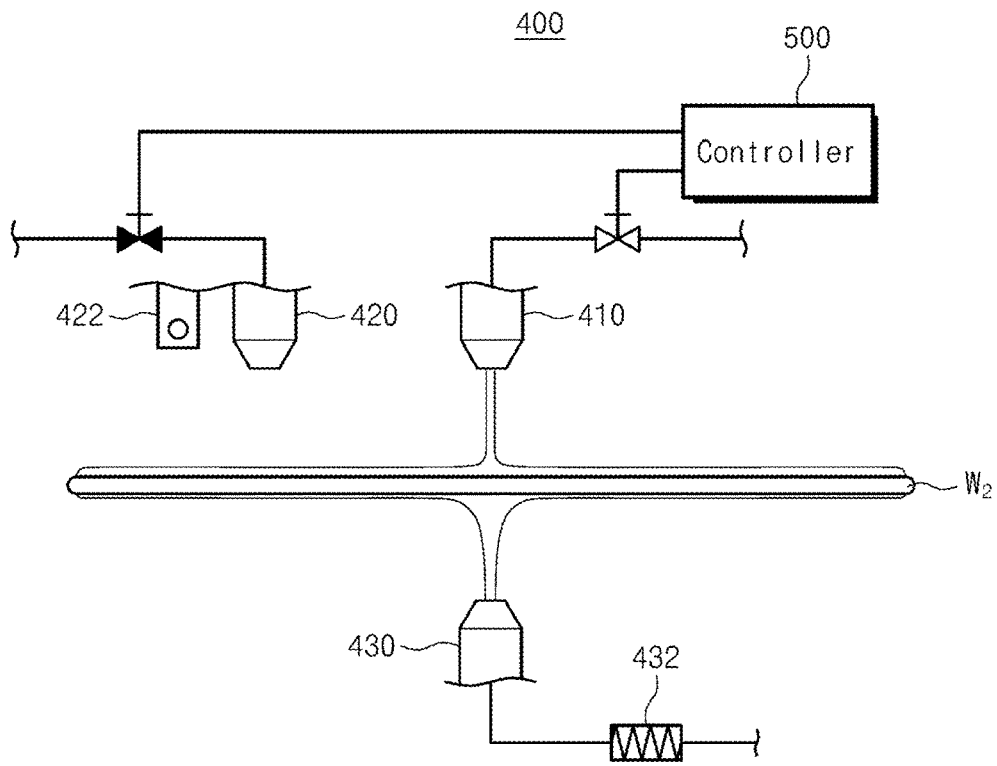

Next, processes of treating a first substrate $W_1$ and a second substrate $W_2$ using the above-described substrate treating apparatus will be described. Here, the first substrate $W_1$ is defined as a substrate having a first film $C_1$ formed thereon, in which ions are implanted. The second substrate $W_2$ is defined as a substrate having a second film $C_2$ formed thereon, in which no ions are implanted. FIG. 3 is a flowchart illustrating a process of treating a substrate. FIGS. 4 and 5 are views illustrating a process of removing the first film on the first substrate using the apparatus of FIG. 2. FIGS. 6 to 8 are views illustrating a process of removing the second film on the second substrate using the apparatus of FIG. 2.

Referring to FIGS. 3 to 5, a method for treating the first substrate $W_1$ includes a solvent dispensing step and an ozone dispensing step. The ozone dispensing step and the solvent dispensing step are sequentially performed.

When the first substrate $W_1$ starts to be treated, the first substrate $W_1$ is rotated by the spin head 340, and constant temperature water is dispensed onto the backside of the first substrate $W_1$. In the ozone dispensing step, the liquid dispensing unit 400 dispenses an ozone liquid onto the rotating first substrate $W_1$ while supplying UV light thereto. Hydroxyl radicals are generated in the ozone liquid by the UV light. The hydroxyl radicals create cracks in the first film $C_1$ and weaken the adhesive force between the first substrate $W_1$ and the first film $C_1$. When the ozone dispensing step is completely performed, the liquid dispensing unit 400 stops dispensing the ozone liquid and supplying the UV light and performs the solvent dispensing step. In the solvent dispensing step, the liquid dispensing unit 400 dispenses an organic solvent onto the rotating first substrate $W_1$. The organic solvent infiltrates into the cracks of the first film $C_1$ and completely removes the first film $C_1$. Simultaneously, the remaining ozone liquid on the first substrate $W_1$ is replaced by the organic solvent, and the substituted organic solvent prevents leaning of patterns.

Referring to FIGS. 3 and 6 to 8, a method for treating the second substrate $W_2$ includes a solvent dispensing step and an ozone dispensing step. The solvent dispensing step is performed before and after the ozone dispensing step. Hereinafter, the solvent dispensing step performed before the ozone dispensing step is referred to as the primary solvent dispensing step, and the solvent dispensing step performed after the ozone dispensing step is referred to as the secondary solvent dispensing step. That is, the primary solvent dispensing step, the ozone dispensing step, and the secondary solvent dispensing step are sequentially performed.

When the second substrate $W_2$ starts to be treated, the second substrate $W_2$ is rotated by the spin head 340, and constant temperature water is dispensed onto the backside of the second substrate $W_2$. In the primary solvent dispensing step, the liquid dispensing unit 400 dispenses an organic solvent onto the rotating second substrate $W_2$. The second film $C_2$ is firstly removed by the organic solvent. When the primary solvent dispensing step is completely performed, the liquid dispensing unit 400 stops dispensing the organic solvent and performs the ozone dispensing step. In the ozone dispensing step, the liquid dispensing unit 400 dispenses an ozone liquid onto the rotating second substrate $W_2$. The ozone liquid in the ozone dispensing step serves to remove organic residue on the second substrate $W_2$. In the ozone dispensing step, whether the lamp 422 supplies light to the second substrate $W_2$ may be determined depending on the type and amount of organic residue. The remaining portion of the second film $C_2$ is secondly removed by the ozone liquid. In this embodiment, it is exemplified that the lamp 422 supplies light to the second substrate $W_2$ in the ozone dispensing step for the second substrate $W_2$. When the ozone dispensing step is completely performed, the liquid dispensing unit 400 stops dispensing the ozone liquid and performs the secondary solvent dispensing step. In the secondary solvent dispensing step, the liquid dispensing unit 400 dispenses an organic solvent onto the second substrate $W_2$ again. The ozone liquid remaining on the second substrate $W_2$ is replaced by the organic solvent, and the substituted organic solvent prevents leaning of the patterns.

When the liquid treating processes for the first substrate $W_1$ and the second substrate $W_2$ are completely performed, a drying process for removing the residual solvent may be additionally performed. The drying process may be a supercritical drying process.

In this embodiment, the ozone liquid and the organic solvent are dispensed in different sequences depending on the types of the photoresist films $C_1$ and $C_2$ and play different roles according to the dispensing sequences.

For example, when the first film $C_1$ is removed, the ozone liquid is dispensed prior to the organic solvent to generate the radicals, thereby increasing the removal rate of the first film $C_1$ by the organic solvent.

In contrast, when the second film $C_2$ is removed, the ozone liquid serves to remove the second film $C_2$ remaining on the second substrate $W_2$, thereby increasing the removal rate of the second film $C_2$. Furthermore, the organic solvent used in the secondary solvent dispensing step is aimed at replacing the ozone liquid rather than removing the second film $C_2$ and prevents leaning of the patterns.

Accordingly, in removing the films as described above, the film removal rate may be increased by dispensing the two or more different liquids and using the properties of the respective liquids.

According to the embodiments of the inventive concept, the film on the substrate is removed by the organic solvent. Thus, surrounding devices may be prevented from being damaged and contaminated.

Furthermore, according to the embodiments of the inventive concept, the organic solvent is used to remove the film, and thus a cost burden and a hindrance to environment may be lowered than when strong acidic chemicals are used.

Moreover, according to the embodiments of the inventive concept, the non-ion implanted film is removed by the organic solvent, and thereafter the organic residue is removed by the liquid containing ozone. Thus, the film removal rate may be increased.

In addition, according to the embodiments of the inventive concept, the ion-implanted film is removed by the liquid containing ozone, and thus the film removal rate may be increased.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a chuck configured to hold the substrate;
    a plurality of nozzles configured to dispense a liquid onto the substrate, which is supported on the chuck, to remove a photoresist film on the substrate; and
    a controller configured to control the plurality of nozzles, wherein the plurality of nozzles includes:
        a solvent nozzle configured to move, toward a center of the substrate, from a standby position to a process position to dispense an organic solvent; and
        an ozone nozzle configured to move, toward the center of the substrate, from an other standby position to the process position to dispense a liquid containing ozone; and
        a lamp disposed adjacent to the ozone nozzle to irradiate UV light on the substrate, while the ozone nozzle dispenses the liquid containing ozone, to generate hydroxyl radicals from the liquid containing ozone, and
    wherein the controller is programmed to control the plurality of nozzles such that, depending on whether the photoresist film has ions implanted therein, the solvent nozzle moves to the process position to dispense the organic solvent onto the substrate to remove the photoresist film, or the ozone nozzle moves with the lamp to the process position to dispense the liquid containing the ozone to remove organic residue on the substrate.

2. The apparatus of claim 1, wherein the controller controls the plurality of nozzles to additionally dispense the organic solvent after dispensing the liquid containing the ozone.

3. An apparatus for treating a substrate, the apparatus comprising:
    a chuck configured to hold the substrate;
    a plurality of nozzles configured to dispense a liquid onto the substrate, which is supported on the chuck, to remove a photoresist film on the substrate; and
    a controller configured to control the plurality of nozzles, wherein the plurality of nozzles includes:
        a solvent nozzle configured to move, toward a center of the substrate, from a standby position to a process position to dispense an organic solvent; and
        an ozone nozzle configured to move, toward the center of the substrate, from an other standby position to the process position to dispense a liquid containing ozone; and
        a lamp disposed adjacent to the ozone nozzle to irradiate UV light on the substrate, while the ozone nozzle dispenses the liquid containing ozone, to generate hydroxyl radicals from the liquid containing ozone, and
    wherein the controller is programmed to control the plurality of nozzles such that the ozone nozzle moves with the lamp to the process position to dispense the liquid containing the ozone, and the solvent nozzle moves to the process position to dispense the organic solvent in different sequences, depending on whether the photoresist film has ions implanted therein.

4. The apparatus of claim 3, wherein when the photoresist film is a film in which the ions are implanted, the controller controls the plurality of nozzles to dispense the organic solvent after dispensing the liquid containing the ozone.

5. The apparatus of claim 3, wherein when the photoresist film is a film in which the ions are not implanted, the controller controls the plurality of nozzles to dispense the liquid containing the ozone after dispensing the organic solvent.

6. The apparatus of claim 5, wherein when the photoresist film is a film in which the ions are not implanted, the controller controls the plurality of nozzles to additionally dispense the organic solvent after dispensing the liquid containing the ozone.

* * * * *